United States Patent [19]
Lee et al.

[11] Patent Number: 5,724,825
[45] Date of Patent: Mar. 10, 1998

[54] AUTOMATIC TEMPERATURE CONTROLLING SYSTEM

[75] Inventors: Wen Hong Lee, Hsinchu; Thomas Chang, Taichung; Simon Chang, Chiayi, all of Taiwan

[73] Assignee: Mosel Vitelic Inc., Hsinchu, Taiwan

[21] Appl. No.: 712,523

[22] Filed: Sep. 11, 1996

[51] Int. Cl.⁶ .................................... F25D 17/02
[52] U.S. Cl. .................. 62/185; 62/259.2; 62/201; 62/126
[58] Field of Search ................ 62/175, 185, 126, 62/201, 259.2

[56] References Cited

U.S. PATENT DOCUMENTS

| | | | |
|---|---|---|---|
| 4,210,957 | 7/1980 | Spethmann | 62/175 X |
| 4,372,129 | 2/1983 | Bennett et al. | 62/185 X |
| 5,201,187 | 4/1993 | Yoshikawa et al. | 62/175 X |
| 5,333,676 | 8/1994 | Mizuno | 62/259.2 X |

*Primary Examiner*—Henry A. Bennett
*Assistant Examiner*—Susanne C. Tinker

[57] ABSTRACT

The present invention relates to an automatic temperature controlling system for semiconductor process, when one of the chillers in the temperature controlling system is out of order, then another chiller will automatically take over the function of the broken one by using the second temperature controlling path. The automatic temperature controlling system includes: at least two chambers used for performing a process having first temperature controlling paths for providing coolant circulations while the system is in normal condition, and having a second temperature controlling path for providing at least one coolant circulation while the system is in abnormal condition; at least two chillers are respectively connected to the chambers for controlling the temperature of the chambers; a plurality of first normal-on valves are used to control the condition of the first temperature controlling paths; a plurality of second normal-on valves are used to control the condition of the first temperature controlling paths; and a plurality of pairs of normal-off valves are used to control the condition of the second temperature controlling paths.

9 Claims, 2 Drawing Sheets

AUTOMATIC TEMPERATURE CONTROLLING SYSTEM

FIELD OF THE INVENTION

The present invention relates to a temperature controlling system, and more particularly, to an automatic temperature controlling system for fabricating semiconductor wafer.

DESCRIPTION OF THE PRIOR ART

The dimensions of the semiconductor devices are scaled down caused by the improvement of the integrated circuit technology. Devices and interconnections are manufactured on a chip about 2 cm$^2$ or less than that area. Temperature is one of the factors to influence the product quality of the semiconductor process. Most of the performance of semiconductor devices is affected by the controlling of the temperature, therefore no matter an annealing or thin film deposition the temperature controlling is very important in the semiconductor process. For example the key reason for thermal stress in a film is caused by unsuitable heat treatment. Further more, the common deposition temperature for polysilicon, low pressure chemical vapor deposition (nitride), and LPTEOS (low pressure tetraethylorthosilicate) are 58°–640° C., 760° C., and 720° C., respectively. The process temperature of forming BPSG (borophosphosilicate glass), well drive-in, and field oxide are in the range between 800°–1150° C. It is so important to use a suitable temperature to control the quality of wafers.

In conventional temperature controlling system, a chamber is typically utilized to perform a semiconductor process. Heat treatment temperature or other process temperature is controlled by a chiller. Further, one chamber is controlled by one chiller in conventional temperature controlling system. Unfortunately, the manufacturing procedure has to be stopped while corresponding chiller is out of order. Then the chiller has to be dismantled and be overhauled before the chiller can be normally operated. The conventional system is not only inconvenient but also not effectual, further more, the throughput of the semiconductor is reduced when the chiller of the conventional system is inoperable.

SUMMARY OF THE INVENTION

The present invention includes a plurality of chambers for performing a process; a plurality of first temperature controlling paths for providing a coolant circulations while the chiller is normal; a plurality of second temperature controlling paths for providing a second coolant circulation while the chiller is abnormal; a plurality of first normal-on valves are connected to the chambers for controlling the condition of the first temperature controlling paths; a plurality of chillers are connected to the first normal-on valves for controlling the temperature of the chambers; a plurality of second normal-on valves are connected to the chillers for controlling the condition of the first temperature controlling paths; a plurality of pairs of normal-off valves are set between two first temperature controlling paths for controlling the condition of the second temperature controlling paths.

The advantage of the present invention is when one of the chillers in the system is broken down, then another chiller will automatically take over the function of the broken chiller by using the second temperature controlling path. Therefore, the chamber can be still normally operated even one of the chillers is out of order. Further, the throughput of the present invention will not be reduced by the problem of the chiller.

DESCRIPTION OF THE PREFERRED EMBODIMENT

Figure 1:
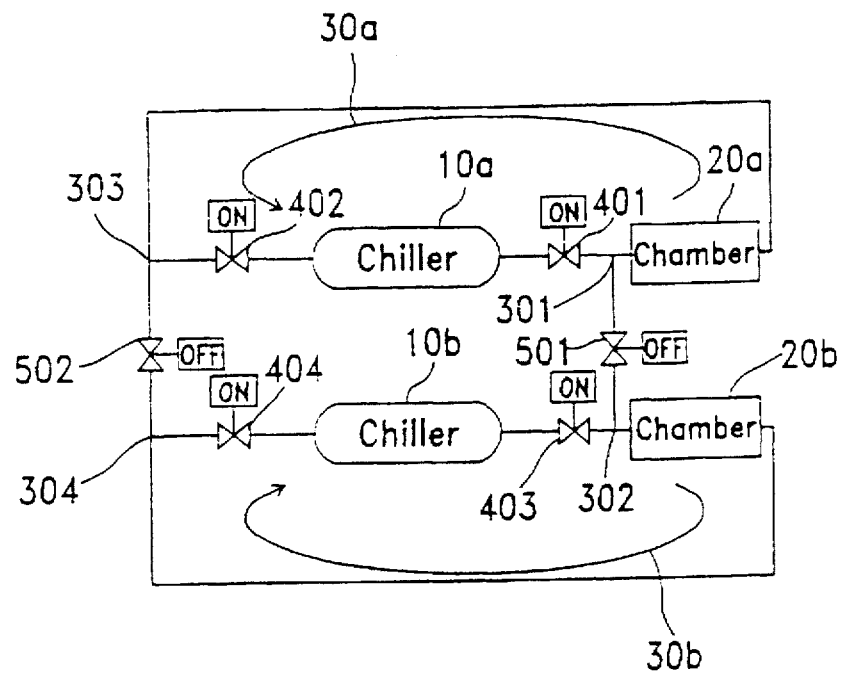
FIG. 1 is an automatic temperature controlling system in the normal condition according to the present invention.
Figure 2:
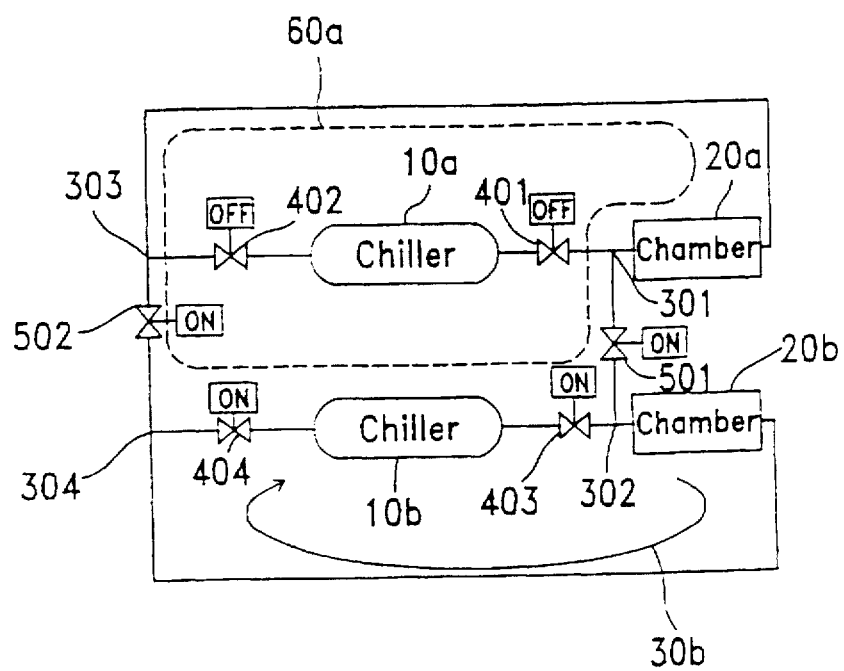
FIG. 2 is an automatic temperature controlling system in the abnormal condition according to the present invention.
Figure 3:
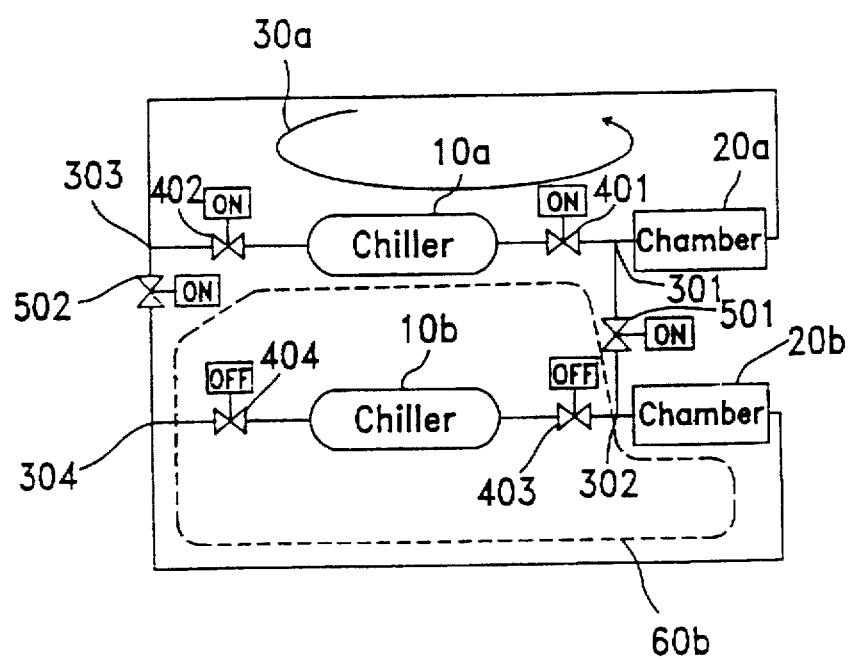
FIG. 3 is an automatic temperature controlling system in the abnormal condition according to the present invention.

FIGS. 1, 2 and 3 show a preferred embodiment of the automatic temperature controlling system. The present invention includes chambers 20a, 20b; chillers 10a, 10b; first temperature controlling paths 30a, 30b; second Ftemperature controlling paths 60a, 60b; normal-on valves 401, 402, 403, 404; normal-off valves 501, 502. The chambers 20a, 20b are typically utilized to perform a semiconductor process. The chillers 10a, 10b are used to control the temperature that the chambers 20a, 20b need.

In normal condition, as shown in FIG. 1, the chiller 10a controls the process temperature of the chamber 20a via the first temperature controlling path 30a, the chiller 10b controls the process temperature of the chamber 20b via the first temperature controlling path 30b. In the first temperature controlling path 30a, the normal-on valve 401 which is turned on is connected to the chamber 20a. The chiller 10a is connected to the normal-on valve 401 for controlling the temperature of the chamber 20a. The normal-on valve 402 which is turned on is substantially connected to the chiller 10a. The other terminal of the chamber 20a is connected to the normal-on valve 402. Similarily, in the first temperature controlling path 30b, the normal-on valve 403 which is turned on is connected to the chamber 20b. The chiller 10b is connected to the normal-on valve 403 for controlling the temperature of the chamber 20b. The normal-on valve 404 which is turned on is connected to the chiller 10b. The other terminal of the chamber 20b is connected to the normal-on valve 404.

The normal-off valves 501, 502 are set between the first temperature controlling path 30a and the first temperature controlling path 30b. In preferred embodiment, the normal-off valve 501 is set between the branch 301 and the branch 302 while the normal-off valve 502 is set between the branch 303 and the branch 304. In the normal condition, the two normal-off valves 501, 502 are typically turned off. So that the chillers 10a, 10b control the temperatures of the chambers 20a, 20b respectively.

In practicing the system, a coolant flows from the chillers 10a to the chamber 20a by passing the normally-on valve 401 for controlling the temperature. Then the coolant flows back to the chiller 10a from the chamber 20a by passing the normally-on valve 402. In the same way, the coolant flows from the chillers 10b to the chamber 20b by passing the normally-on valve 403 for controlling the temperature. Then the coolant flows back to the chiller 10b from the chamber 20b by passing the normally-on valve 404.

All of the normally-on valves 401, 402, 402, and 404 are solenoid valves, so are the normally-off valves 501, 502. When the chiller 10a or the chiller 10b is out of order, which is detected by the alarm signal of the chiller itself, then an electric current is generated by the alarm signal to change the condition of the normally-on valves and the normally-off valves. As shown in FIG. 2. In the abnormal condition, i.e. one of the chillers 10a 10b is broken down, for example, the chiller 10a is not working. The alarm signal of the chiller 10a will detect that the chiller 10a is out of order. Then a current will be generated by the alarm signal to modify the condition of the normally-on valves 401, 402 and the normally-off valves 501, 502. In other words, the normally-on valves 401,402 are turned off while the normally-off valves 501, 502 are turned on. Thus, the second temperature controlling path 60a is formed when the chiller 10a is inoperable.

Still referring to FIG. 2, in the second temperature controlling path 60a, the normally-off valve 501 is connected to the chamber 20a, the normally-on valve 403 is connected to the normally-off valve 501, the chiller 10b is connected to the the normally-on valve 403, the normally-on valve 404 is connected to chillers, the normally-off valve 502 is connected to the normally-on valve 404, the other terminal of the chamber 20a is connected to the normally-off valve 502. Therefore, the coolant can flow from chiller 10b and pass through normally-on valve 403, the normally-off valve 501, to the chamber 20a. Then the coolant flows from the chamber 20a back to the chiller 10b via the normally-off valve 502 and the normally-on valve 404.

Similarily, Turning to FIG. 3, when the chiller 10b is out of order then the normally-off valve 501, 502 are turned on, and the normally-on valve 403, 404 are turned off. In the second temperature controlling path 60b, the coolant flows from chiller 10a, then passes through normally-on valve 401, the normally-off valve 501 to the chamber 20b. Then from the chamber 20b back to the chiller 10a via the normally-off valve 502 and the normally-on valve 402.

The advantage of the present invention is that if one of the chillers in the system is broken down, then another chiller will automatically take over the function of the broken chiller by using the second temperature controlling path. Therefore, the chamber can be still normally operated even one of the chillers is out of order. Further, the throughput of the present inventon will not be reduced by the problem of the chiller.

As is understood by a person skilled in the art, the foregoing preferred embodiment of the present invention is illustrative of the present invention rather than limiting of the present invention. For example, the present invention uses two chillers and two chambers as the preferred embodiment, it is also can be used plural of chillers and chambers. It is intended to cover various modifications and similar arrangements included within the spirit and scope of the appended claims, the scope of which should be accorded the broadest interpretation so as to encompass all such modifications and similar structure.

What is claimed is:

1. An automatic temperature controlling system, said system comprising:

at least two chambers having first temperature controlling paths operable simultaneously for providing coolant circulations while said system is in normal condition, and having second temperature controlling paths operable one at a time for providing at least one coolant circulation while said system is in an abnormal condition; at least two chillers connected to said chambers for controlling the temperature of said chambers by circulating coolant respectively;

a pair of first normal-on valves responsive to said chillers for controlling the condition of said first temperature controlling paths respectively, each said first normal-on valve is located between each said chiller and said chamber in the flow direction of the coolant;

a pair of second normal-on valves responsive to said chillers for controlling the condition of said first temperature controlling paths respectively, each said second normal-on valve is located between each said chamber and said chiller in the flow direction of the coolant; and a pair of normal-off valves responsive to said chillers for controlling the condition of said second temperature controlling paths respectively, said pair of normal-off valves are located between said first temperature controlling paths.

2. The system of claim 1, wherein said system further comprises detecting means responsive to said chambers to detect whether said chambers are in a normal or abnormal condition.

3. The system of claim 2, wherein said pair of first normal-on valves are solenoid valves.

4. The system of claim 2, wherein said pair of second normal-on valves are solenoid valves.

5. The system of claim 2, wherein said pair of normal-off valves are solenoid valves.

6. The system of claim 3, wherein a current is generated by said detecting means to change the condition of said first normal-on valve.

7. The system of claim 4, wherein a current is generated by detecting means to change the condition of said second normal-on valve.

8. The system of claim 4, wherein a current is generated by detecting means to change the condition of said normal-off valve.

9. An automatic temperature controlling system, said system comprising:

a pair of first temperature control paths, each of said first temperature control paths comprising:

a chiller;

a first normal-on valve connected to the chiller on one side thereof;

a chamber connected to the first normal-on valve, such that said first normal-on valve is between said chiller and said chamber; and a second normal-on valve connected to the chiller on the other side thereof, said second normal-on valve also connected to said chamber such that said chiller, said first normal-on valve, said chamber and said second normal-on valve form a loop;

a pair of normal-off valves connecting said first temperature control paths to each other, a first of said normal-off valves connecting the first temperature control paths at corresponding points between the first normal-on valve and the chamber to which said first normal-on valve is connected, and a second normal-off valve connecting the temperature control paths at corresponding points between the chamber and the second normal-on valve to which said chamber is connected; wherein said normal-off valves are closed and said normal-on valves in both of said first temperature control paths are open, thereby allowing a coolant to circulate through said pair of first temperature control paths, when said system is in a normal condition, and said normal-off valves are open and said first and second normal-on valves in one of said pair of first temperature control paths are closed, thereby allowing said coolant to circulate through the chambers of both of said pair of first temperature control paths and the chiller of the other of said pair of first temperature control paths, when said system is in an abnormal condition.

* * * * *